United States Patent
Ekstrand et al.

(10) Patent No.: US 6,606,037 B2
(45) Date of Patent: Aug. 12, 2003

(54) QUALITATIVE MODELING AND COMPRESSION OF REQUEST SEQUENCES IN ARQ PROTOCOLS

(75) Inventors: Nicklas Ekstrand, Södra Sandy (SE); Béla Rathonyi, Malmö (SE); Yuri Chtarkov, Moscow (RU); Ben Smeets, Dalby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/010,317

(22) Filed: Nov. 13, 2001

(65) Prior Publication Data

US 2003/0098804 A1 May 29, 2003

(51) Int. Cl.⁷ .................................. H03M 7/00
(52) U.S. Cl. .......................... 341/50; 455/352
(58) Field of Search ............... 341/51, 50, 107; 455/423, 352; 370/328; 375/240.27

(56) References Cited

U.S. PATENT DOCUMENTS 4,363,036 A * 12/1982 Subramaniam ............ 382/238
5,710,562 A * 1/1998 Gormish et al. ............ 341/106

OTHER PUBLICATIONS

Nicklas Ekstrand, "Universal Lossless Source Coding Techniques for Images and Short Data Sequences", Doctoral Thesis, Apr. 6, 2001; Lund Institute of Technology, Lund, Sweden.

* cited by examiner

*Primary Examiner*—Peguy JeanPierre
(74) *Attorney, Agent, or Firm*—Jenkens & Gilchrist, P.C.

(57) ABSTRACT

Method and system are disclosed for compressing the data in the request sequence of an ARQ algorithm. A probability estimation module receives the request sequence from the ARQ algorithm and estimates a probability associated with each symbol or bit in the sequence according to a customized Markov model. The estimated probabilities are thereafter provided to an entropy encoder module, which uses the estimated probabilities to encode each symbol or bit in the request sequence. The encoded request sequence is then transmitted in a repeat request in accordance with the ARQ algorithm.

32 Claims, 9 Drawing Sheets

FIG. 9

US 6,606,037 B2

QUALITATIVE MODELING AND COMPRESSION OF REQUEST SEQUENCES IN ARQ PROTOCOLS

CROSS-REFERENCE TO RELATED APPLICATIONS

This application is related to, claims priority from, and hereby incorporates by reference, U.S. Provisional Application No. 60/248,163, entitled "The Qualitative Modeling and Compression of the Request Sequences in ARQ Protocols," filed with the U.S. Patent and Trademark Office on Nov. 13, 2000.

BACKGROUND

1. Field of the Invention

The present invention relates to data compression and, more particularly, to a method and system for compressing the repeat request data in Automatic Repeat reQuest (ARQ) protocols used in telecommunication systems.

2. Description of the Related Art

In many telecommunication systems such as the Universal Mobile Telecommunication System (UMTS), data is transmitted over a communication channel in blocks of predefined sizes. During the transmission, the blocks may become corrupted in spite of various preventive measures and error correction techniques used, such as forward-feed error correction (FEC). Through the use of cyclic redundancy checks (CRC), the corrupted or erroneous blocks can be detected with a high degree of accuracy and reliability. Once the errors are detected, a request for retransmission of the corrupted or erroneous blocks, called a repeat request, may be issued. Issuance of the repeat request is usually done as part of an Automatic Repeat reQuest (ARQ) protocol, which is a common procedure used in modern telecommunication systems, such as UTMS, to recover from erroneous block transmissions.

Figure 1:
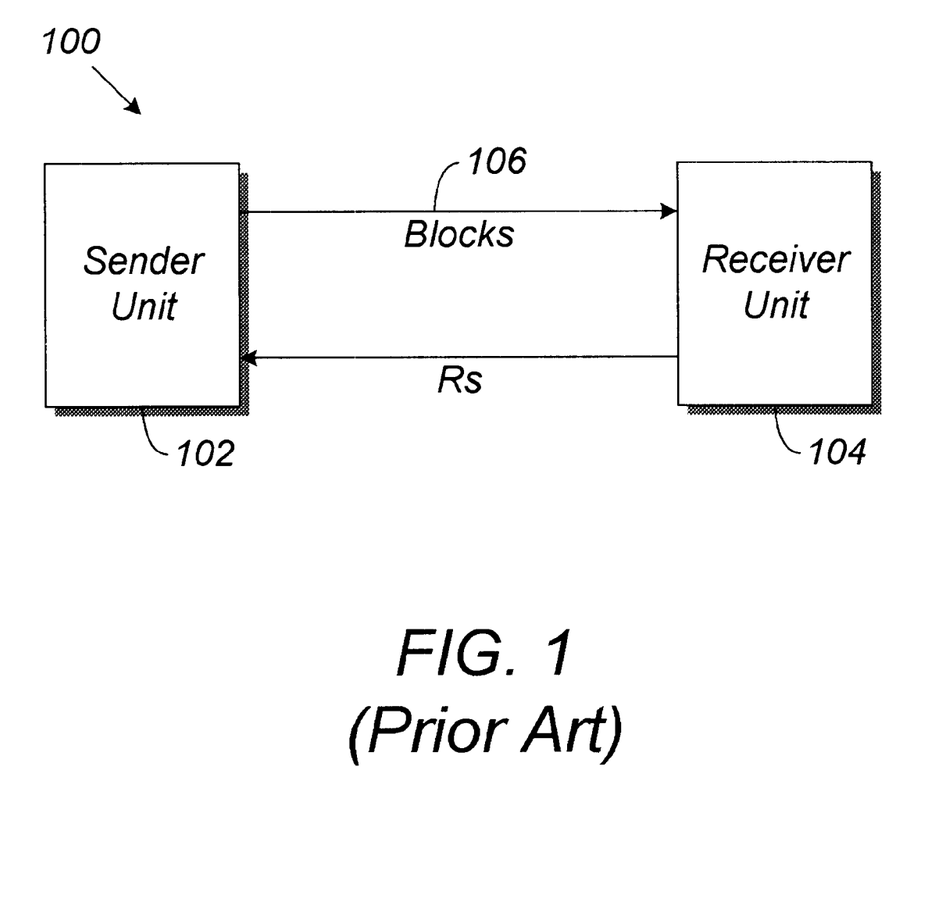
FIG. 1 illustrates a portion of an exemplary telecommunication system.

FIG. 1 is a functional block diagram illustrating an exemplary portion of a typical telecommunication system. As can be seen, the system includes a sender unit 102 that is configured to send blocks of data to a receiver unit 104 over a communication channel 106. Whenever possible, the sender unit 102 tries to transmit a continuous stream of blocks to the receiver unit 104. At the receiver unit 104, the data blocks are verified (e.g., using a CRC) to ensure the data is correctly received. If one or more blocks of data are found to be corrupted or otherwise erroneous, the receiver unit 104 issues a request to the sender unit 102 to retransmit the bad blocks. The repeat request typically includes a series or sequence of bits composed in such a way so as to represent or otherwise indicate which particular blocks need to be retransmitted. Such a request sequence is designated as Rs in FIG. 1. The timing of the request sequence Rs is usually at regular intervals that may vary in accordance with the system's ARQ protocol.

A number of techniques exist for composing the request sequence Rs. One such technique, called a "list" technique, involves listing the sequence number of the blocks that need to be retransmitted. During normal transmission, each block is assigned one number in a sequence of numbers of a predetermined length. At the receiver end, the sequence number of the block that is corrupted or erroneous is determined, then sent as part of the request sequence Rs to identify the blocks that need to be retransmitted.

Another technique, called a "bitmap" technique, involves using a string of 1s and 0s in the request sequence Rs to identify the blocks that need to be retransmitted. In this technique, a 1 or a 0 is used to denote each block that was received. For example, a 1 may be used to denote a block that has been successfully received and a 0 to denote a block that is erroneous or idle (i.e., no block was received). Thus, a type of bitmap representing the received blocks may be composed with the 0s indicating the blocks that need to be retransmitted.

For very long sequences, however, neither of the above techniques are very practical or economical in terms of bandwidth usage. Therefore, in general, some encoding (compression) of the data in the request sequence Rs is needed.

Data compression can be efficiently performed when certain statistical parameters about the data that is to be compressed are known (e.g., type of data, length of data, generating source). The difficulty with encoding the data in the request sequence Rs, however, is that very little statistical information about the data can be used. For example, although there is a significant amount of correlation between consecutive request sequences, it is uncertain whether one or more of the transmitted sequences will actually be received by the sender unit. Hence, it is usually assumed that there is no correlation between the request sequences Rs (i.e., a decision is made not to use any correlation data). Thus, the probability of any particular combination or distribution of erroneous blocks occurring for a given sequence of transmitted blocks is usually unknown. Due to this lack of knowledge, most presently available algorithms used to compress the ARQ request sequence are "universal," that is to say, they can adapt their compression scheme to the unknown parameters of a known statistical model of the data or a set of models.

Consider the bitmap approach described above. If no errors occur during the transmission, then the request sequence Rs becomes a binary sequence 111 . . . 100 . . . 0 of a given length N. Any such sequence may be described entirely by its length of $n^*$ number of 1s, which is less than or equal to N (that is, $n^* \leq N$), and it is sufficient to encode (describe) $n^*$ by either a uniform coding (e.g., of length ($\log_2$ N)) or a variable length prefix coding. The advantages of such variable length coding are not clearly obvious and, therefore, if one assumes a uniform coding is used, the result is a compression with a ratio of $N/(\log_2 N)$.

If block errors occur, the errors result in the substitution of the continuous run of 1s in the request sequence Rs 11 . . . 100 . . . 0 by a binary sequence $x^n$ that includes both 1s and 0s mixed together, where $n \geq n^*$, but the value of N does not change (that is to say, the length of the run of trailing 0s decreases). The problem, therefore, is to be able to describe the value of n and $x^n$ using as efficient a coding as possible. The most efficient coding of $x^n$, which is a bitmap of the errors, is based on knowing the probability of any/all bitmaps of a given length n occurring. Unfortunately, the probabilities of these bitmaps occurring are usually not known. Sometimes, a known source model (e.g., a two state Markov model), or a rather narrow set of such models, is used for increasing the coding efficiency. This is referred to as "universal" coding. For compression of the request sequence data, however, such universal coding does not work well because the statistical properties of the bitmaps are defined by the statistical properties of the error sequence $e^q = e_1, \ldots, e_n$, where $e_i \in \{0, 1\}$ and by the ARQ algorithm, and both of these "components" are practically unknown and/or very complex to describe.

In fact, error sequences are "generated" by many sources of many different natures, and their mixture in different proportions defines a very wide class of possible sources. However, even for a small set of source models (or just one model), one cannot translate the statistics of the error sequence into the statistics of the bitmaps. For one thing, the complexity of any ARQ algorithm leaves little chances of solving this problem. Thus, the problem of compressing the request sequence data can be generalized as one of encoding (compressing) the output of a "black box" (i.e., the ARQ algorithm) using input signals (i.e., the error sequence) that are unknown (from the sender's perspective).

Accordingly, it is desirable to be able to provide a method and system for compressing the data in the request sequence of an ARQ algorithm, and to be able to do so in a way that is both computationally efficient and simple to implement.

SUMMARY OF THE INVENTION

The present invention is related to a method and system for compressing the data in the request sequence of an ARQ algorithm. The system and method of the present invention include an entropy encoder module and a probability estimation module. The probability estimation module receives the request sequence from the ARQ algorithm and estimates a probability associated with each symbol or bit in the sequence according to a customized Markov model. The estimated probabilities are thereafter provided to the entropy encoder module, which uses the estimated probabilities to encode each symbol or bit in the request sequence. The encoded request sequence is then transmitted in a repeat request in accordance with the ARQ algorithm.

In general, in one aspect, the invention is related to a method of encoding a request sequence from an automatic repeat request system. The method comprises the steps of receiving the request sequence from the automatic repeat request system, each request sequence including a sequence of binary symbols, and counting a number of 0s and 1s in the sequence of binary symbols in accordance with a Markov model. The method further comprises estimating a probability associated with each binary symbol based on the number of 0s and 1s counted in each state of the Markov model, and encoding the binary symbols on a symbol-by-symbol basis using the probability estimates.

In general, in another aspect, the invention is related to a method of decoding an encoded request sequence from an automatic repeat request system. The method comprises the steps of receiving the encoded request sequence from the automatic repeat request system, and decoding the encoded request sequence into a sequence of binary symbols on a symbol-by-symbol basis. The method further comprises counting a number of 0s and 1s in the sequence of binary symbols in accordance with a Markov model, and estimating a probability associated with each binary symbol based on the number of 0s and 1s counted in each state of the Markov model.

In general, in still another aspect, the invention is related to an encoder for encoding a request sequence from an automatic repeat request system. The encoder comprises a probability estimation module configured to receive the request sequence including a sequence of binary symbols from the automatic repeat request system, the probability estimation module further configured to count a number of 0s and 1s in the sequence of binary symbols in accordance with a Markov model, and to estimate a probability associated with each binary symbol based on the number of 0s and 1s counted in each state of the Markov model. The encoder further comprises an encoder module configured to encode the binary symbols on a symbol-by-symbol basis using the probability estimates thereof.

In general, in yet another aspect, the invention is related to a decoder for decoding an encoded request sequence from an automatic repeat request system. The decoder comprises a decoder module configured to receive the encoded request sequence and to decode the encoded request sequence into a sequence of binary symbols, wherein the decoder module decodes the encoded request sequence on a symbol-by-symbol basis. The decoder further comprises a probability estimation module configured to count a number of 0s and 1s in the sequence of binary symbols in accordance with a Markov model, and to estimate a probability associated with each binary symbol based on the number of 0s and 1s counted in each state of the Markov model.

It should be emphasized that the term comprises/ comprising, when used in this specification, is taken to specify the presence of stated features, integers, steps, or components, but does not preclude the presence or addition of one or more other features, integers, steps, components, or groups thereof.

BRIEF DESCRIPTION OF THE DRAWINGS

A more complete understanding of the present invention may be had by reference to the following detailed description when taken in conjunction with the accompanying drawings, wherein.

DETAILED DESCRIPTION OF THE DRAWINGS

Following is a detailed description of the drawings wherein reference numerals for like and similar elements are carried forward.

Embodiments of the invention provide a method and system for encoding (compressing) the data in the request sequence Rs of an ARQ algorithm. In some embodiments, the encoding system and method of the present invention includes an entropy encoder module and a probability estimation module. The probability estimation module receives the request sequence Rs from the ARQ algorithm and estimates a probability associated with each symbol or bit in the sequence. The probability associated with each symbol or bit in the request sequence Rs is estimated according to a customized Markov model. The estimated probabilities are thereafter provided to the entropy encoder module, which uses the estimated probabilities to encode each symbol or bit in the request sequence Rs. The encoded (compressed) request sequence data, along with the length of the data, is then transmitted in a repeat request in accordance with the ARQ algorithm. An entropy decoder module corresponding to the entropy encoder module is used to decode the encoded data back into the original request sequence Rs.

In some embodiments, the entropy encoder of the present invention may be any known entropy encoder such as a Huffman encoder or a Shannon-Fano encoder. In a preferred embodiment, the entropy encoder of the present invention is an arithmetic symbol encoder that is capable of encoding data on a symbol-by-symbol basis in a known manner (see, e.g., C. Jones, "An Efficient Coding System for Long Source Sequences," *IEEE Transaction on Information Theory*, 27(3):280–291, May 1981; Rissanen and Mohiuddin, "A Multiplication-Free Multialphabet Arithmetic Code," *IEEE Transaction on Communications*, 32(4):93–98, July 1989) using the probabilities provided by the probability estimation module. Furthermore, although the invention is described with respect to a lossless encoder (i.e., the entropy encoder), the invention is not to be limited thereto and may be applicable to a lossy encoder as well.

Figure 2:
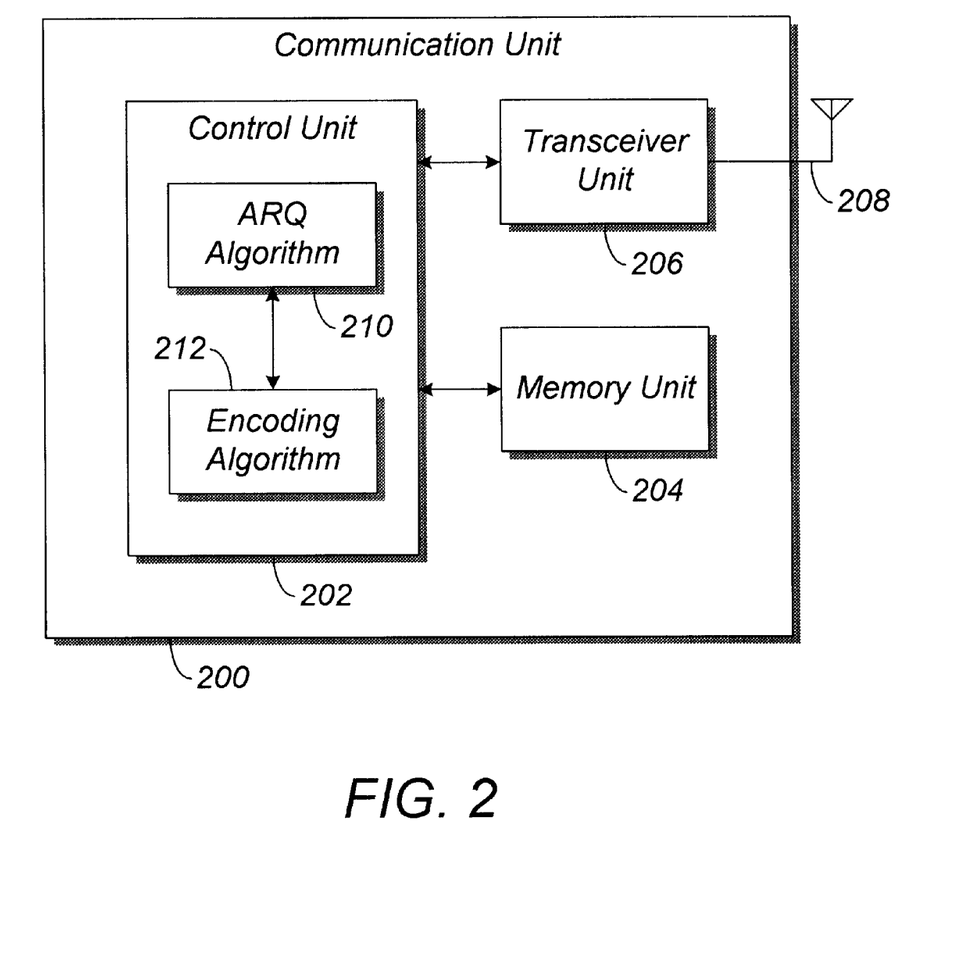
FIG. 2 illustrates a receiver unit according to some embodiments of the present invention.

Referring now to FIG. 2, a communication unit 200 is shown that is capable of receiving data blocks, checking the blocks for errors, and generating a request sequence Rs for the erroneous blocks in accordance with an ARQ protocol. In some embodiments, the communication unit 200 is also capable of encoding the data in the ARQ request sequence Rs in accordance with the principles and teachings of the present invention. Such a communication unit 200 may be a mobile communication device, for example, a handheld computer or mobile phone, or it may be a part of an infrastructure unit such as a base transceiver station or a core network node. While only the communication unit 200 is expressly shown, it should be recognized that a sending unit is required to transmit the data blocks to the communication unit 200 and also to retransmit certain data blocks upon reception of the encoded request sequence Rs from the communication unit 200. For purposes of this description, however, only the communication unit 200 and the encoder algorithm therein will be described in detail.

The communication unit 200 has a number of functional components therein including a control unit 202, a memory unit 204, and a transceiver unit 206, all interconnected as shown. The transceiver unit 206 is a typical transceiver unit that is capable of both sending and receiving radio frequency signals. An antenna 208 is connected to the transceiver unit 206 in order to facilitate the transmission and reception of the radio frequency signals. The memory unit 204 may be any memory unit (e.g., RAM, ROM, magnetic memory, optical memory) that is capable of storing any data or software programs needed by the receiver unit 200 for operation thereof. The control unit 202, in general, is responsible for the overall operation of the receiver unit 200 including execution of various software programs and management of the memory unit 204, transceiver unit 206, and any other components of the receiver unit 200.

In some embodiments, the control unit 202 has an ARQ algorithm 210 and an encoding algorithm 212 executing thereon. The ARQ algorithm 210 is a typical automatic repeat request algorithm such as the RLC (Radio Link Control) algorithm used in the UMTS system, and is responsible for detecting which data blocks have been corrupted or are otherwise erroneous, and requesting retransmission of some or all of those blocks. The encoding algorithm 212 is configured to operate in conjunction with the ARQ algorithm 210 to compress or otherwise reduce the size of the data conveyed in the request sequence Rs. Following is a description of the encoding algorithm 212.

Figure 3:
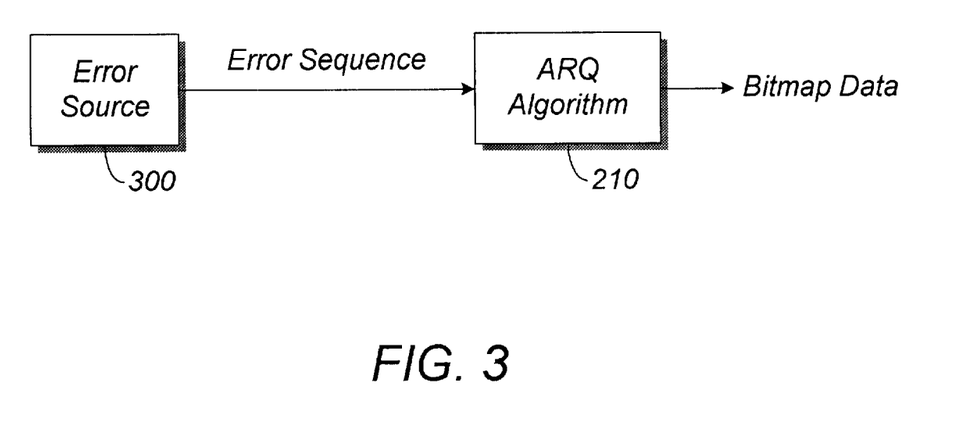
FIG. 3 illustrates a simplified error model according some embodiments of the invention.

As an initial matter, it should be noted that the error model used herein is based on the simplified error model shown in FIG. 3. The input of the ARQ algorithm 210 may be modeled as an error source 300, the output of which may be a continuous stream of 1s and 0s called the error sequence $e^q = e_1, \ldots, e_n$, where $e_i \in \{0, 1\}$, and where the 1s represent correctly received blocks, and the 0s represent erroneously received blocks or blocks that were not received at all. This error sequence $e^q$ is inputted into the ARQ algorithm 210, which generates a request sequence Rs in the form of a bitmap having a predefined size N and composed of a binary sequence $x^n = x_1, \ldots, x_n$, where $x_i \in \{0, 1\}$. Depending on the particular ARQ algorithm 210 used, retransmission may be requested for all of the erroneous blocks, or only for certain, selected ones of the erroneous blocks. Therefore, the amount of data received at the input of the ARQ algorithm 210 is not necessarily the same as the amount of data at the output of the ARQ algorithm 210. Also, the first position in each error sequence is always a 0, denoting an erroneously received block or a block that was not received at all. Moreover, the error sequence may contain two types of errors: independent errors and burst errors. The independent errors introduce isolated 0s into the error sequence, and the burst errors generate two or more consecutive 0s, or a run of 0s, in the error sequence.

Although 1s are used herein to represent correctly received blocks and 0s to represent erroneously received blocks (or blocks that were not received at all), the invention is not to be limited to this particular notation, and that other notations may certainly be used (e.g., 1s for erroneous blocks and 0s for correctly received blocks) without departing from the scope of the invention.

For telecommunication systems, there is a natural grouping of errors associated with the conditions of signal propagation in mobile communication. However, not all transmission errors occur due to the signal propagation conditions. There is usually a certain level of noise present on the radio link and also in the physical devices themselves that result in independent block errors in the error sequence. Thus, in most telecommunications systems, it is expected there will be mixture of independent errors and burst errors. The compression scheme that is used, therefore, needs to be able to handle a mixture of independent errors, as well as a reasonable number of unknown parameters. The independent errors in the error sequence are later reflected as independent errors in the bitmap. For these independent errors, a "memoryless" model needs to be used, that is, a model where the errors do not depend on the order of occurrence of prior events. For a binary sequence in a memoryless model, the number of unknown parameters is one.

Although in principle, the independents errors may be encoded, there is no efficient way to describe the independent errors no matter what compression scheme is used. For this reason, existing techniques simply use the bitmap approach, which describes the position of the last 1 in the bitmap, then provide a raw description of the bitmap. For burst errors, existing techniques use the list approach, which describes in a list the positions where the bitmap changes from a run of one symbol to a run of the other symbol. The resulting code word for each such description could be described either by a fixed number of bits, or by using arithmetic encoding where the probability of each run is uniformly distributed over the possible range of values. Using arithmetic encoding is somewhat more complex, but yields a significantly better result if there are many runs in the bitmap.

Another approach, based on the list approach, is to estimate the probability of each length of run. Recall that in the list approach, a uniform description is used for runs of all lengths. The problem with this approach, however, is the number of unknown parameters that result. For example, for k possible lengths of runs, there will be k−1 unknown parameters. As alluded to earlier, the number of unknown parameters are of major importance to the performance of any compression algorithm. For most telecommunication systems, the k possible lengths of runs will be of the same order as the maximum length of the bitmap. Thus, the number of unknown parameters needs to be reduced first for this approach to be used.

In general, it is difficult to find an optimal or even a good scheme for compressing the data of the request sequence Rs because, as mentioned above, the statistical properties of the error sequence $e^q$ is practically unknown. However, by adding some restrictions and through the use of additional, observed information, the problem can be somewhat simplified. First of all, practical restrictions on the length of the bitmap (e.g., lengths of $2^i$, where i=8, 9 . . . , 12) result in constraints on the number of unknown parameters in the model. It has also been observed that the "main" statistical properties of the error sequence $e^q$ and the bitmap $x^n$ are more or less the same. For example, the statistics of the runs of 0s (i.e., runs of errors) on the input of the ARQ algorithm and the runs of 0s on the repeat requests of the output of the ARQ algorithm are more or less the same.

With these restrictions in mind, consider the properties of the runs of 0s, that is, the sequences $0^m1$ where m indicates a run of 0s (m≧0) and a terminating 1. For example, the error sequence $e^{19}$=0100000111100010111 may be described in terms of the runs of 0s, namely, the m values: 1, 5, 0, 0, 0, 3, 1, 0, 0. Furthermore, by estimating the conditional probability p(m| . . . ) of the length of each run, the statistics of any binary stationary sequence can be described by the set of probability distributions {p(m| . . . ), m≦n} of the lengths of the runs of 0s, where the condition is some prior event (indicated by the " . . . " inside the parentheses). The condition may be, for example, the prior occurrence of a number of preceding symbols (e.g., a run of 0s or 1s).

Figure 4:
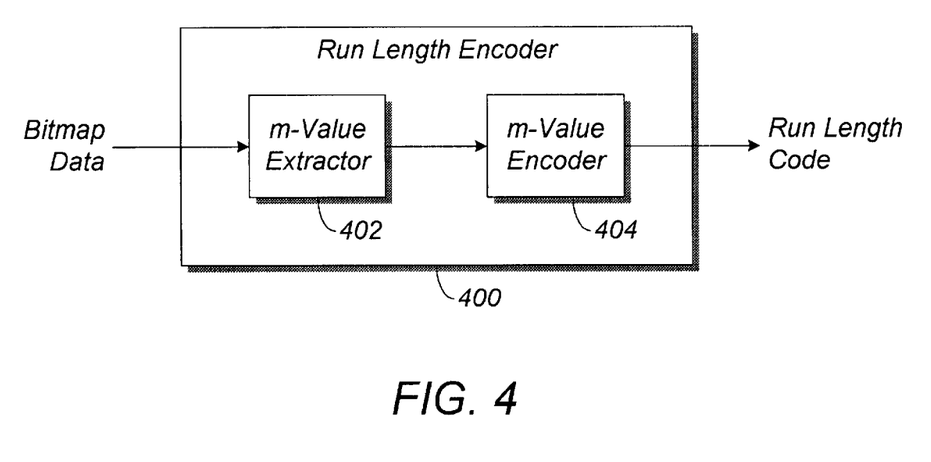
FIG. 4 illustrates an industry standard run-length encoder module.

An example of an encoder that is based on the above technique is the run-length encoder shown in FIG. 4. The run-length encoder 400 of FIG. 4 includes an m-value extractor 402 that is configured to extract the values of m, or the runs of 0s, from the error sequence. Thus, in the error sequence $e^{19}$ above, for example, the m-value extractor 402 is configured to extract the m values 1, 5, 0, 0, 0, 3, 1, 0, 0. An m-value encoder 404 receives the values of m from the m-value extractor 402 and outputs a code corresponding to each value of m. An example of the codes that may be outputted by the m-value encoder 404, called run-length codes, may be found in 3GPP TS 04.60 V8.10.0 (2001-06), section 9.1.10, specifically in Table 7, entitled "Terminating codes (reproduced from ITU-T T.4); T.4 code words used for representing run lengths of 1 zero and 3 zeros are interchanged." Although in this example the m values are extracted from the error sequence for illustration purposes, in practice the m values are typically extracted from the bitmaps. Note that the number of parameters involved when coding the m values are at most n and decreases for each m value that has been encoded.

The number of unknown parameters (i.e., parameters that have to be estimated) decreases if one can partition the set of all values of m into a set G of J non-intersected groups (or subsets) $G_j$ (1≦j≦J). Thus, the values of m may be partitioned into the following exemplary groups: $G_0$={0}, $G_1$={1, 2}, and $G_2$={4, 5, 6, . . . }. In other words, instead of estimating the probability for all possible m values, only the probabilities for three different groups of m values need to be estimated. The groups $G_j$ of m values may be used to represent approximately any conditional probability $\hat{p}(m)$ as follows:

$$\hat{p}(m)=P_j f(m|G_j), m\epsilon G_j, 1\leq j\leq J \quad (1)$$

where $P_j$ is a sum of p(m) over all m∈$G_j$ and the conditional probability distributions {f(m|$G_j$), m∈$G_j$} are supposed to be known or reasonably chosen. The interval grouping G* with groups $G_j$=[$m_j$, $m_{j+1}$−1], 0=$m_1$< . . . <$m_{J+1}$=n+1, is one of the most natural. The grouping is also described by the memoryless model, generating the number j of groups with the probability $P_j$, which lets f(m|$G_j$) describe m∈$G_j$. Note that if the partitioning set G is not known or chosen beforehand, then it can be adaptively chosen in the process of coding. This approach, however, is not discussed herein.

Consider now the sequential arithmetic coding (see, e.g., C. Jones, "An Efficient Coding System for Long Source Sequences," *IEEE Transaction on Information Theory*, 27(3):280–291, May 1981; Rissanen and Mohiuddin, "A Multiplication-Free Multialphabet Arithmetic Code," *IEEE Transaction on Communications*, 32(4):93–98, July 1989) of the bitmap $x^n$, where the bitmaps are independent of each other. Thus, the unconditional or conditional coding probabilities can only depend on the current statistics of the encoded bitmap. Taking into account the assumed similarity of the main statistical properties between the error sequences $e^q$ and the bitmaps $x^n$, several bitmap encoders were tried (the results from which are reproduced below) based on a knowledge of the statistical properties of the error sequences $e^q$.

Let the conditional probability p(m| . . . ) be independent of the symbols preceding the last 1, and let the grouping G and the conditional probabilities f(m|$G_j$) be known or chosen beforehand. Then the probabilities of $P_j$ are the only unknown statistical variables, and which may be estimated in the process of coding (with the help of $x^k$, k=1, . . . ). As in many cases (see, e.g., Y. Shtarkov, T. Tjalkens, and F. Willems, "Multi-Alphabet Universal Coding of Memoryless Sources," *Problems of Information Transmission*, 32(2):20–35 1995), the best current estimate of $P_j$ is given by the expression:

$$\hat{P}_j(x^k)=\frac{t_j(x^k)+1/2}{T(x^k)+J/2}, j=1, 2, \cdots, J, \quad (2)$$

where the term $t_j(x^k)$ is the number of runs of 0s of lengths m∈$G_j$ in $x^k$ and $T(x^k)$ is the sum of $t_j(x^k)$ over all j≦J (where $T(x^k)$ can be essentially smaller than k). Substitution of the estimate in Equation (2) in Equation (1) defines the current coding probability for a run of 0s of length m, which results in the increasing of the codeword length of approximately 0.5 $\log_2$ (πn/J). Thus, the encoder must wait until the end of the current run (i.e., until the appearance of a 1), or in other words, the encoder has a variable coding delay.

It follows from the above discussion that the sequential universal coding of binary symbols of the bitmap $x^n$ may be based on the m-value probabilities given in Equation (1) and on the symbol probability estimates given in Equation (2). Further, the value of the cumulative redundancy in the coding is not less than in the first case (i.e., when the "natural" description of $x^n$ as a sequence of independent runs is used) and depends on the grouping used.

Thus, since an encoder model with a small number of unknown parameters must be used, but with unknown conditional probabilities $\tilde{p}(m|G_j)$, in some embodiments, symbol coding, or coding on a symbol-by-symbol basis, is used. Then, the problem of the unknown conditional probabilities $f(m|G_j)$ does not arise at all. First of all, one must separately encode the runs of length m=0; the encoding with the help of mixed statistics $t_f(x^k)$ is inefficient. This rule corresponds to the general principle that 1s and 0s should be encoded separately. The second condition is not so obvious and is based on the observation that usually independent errors arise with rather small probability and almost do not influence the number of runs of lengths m>1. Therefore, for a mixture of independent errors and runs, it is better to consider the case m=1 and m>1 separately. The task, therefore, is to find an encoder model that satisfies both conditions.

The simple memoryless model of the encoder has only one unknown parameter and is well matched with the memoryless model of the error sequences. However, it does not satisfy the second condition, and it is easy to predict that it will not be sufficiently efficient for the coding of long runs.

The simple Markov chain (of order 1) with states "0" and "1" is the best or close to the best source model with two unknown parameters. (See, e.g., Ekstrand, Nicklas, "Universal Lossless Source Coding Techniques for Images and Short Data Sequences," Lund Institute of Technology, Lund University, Ph.D. thesis, Apr. 6, 2001.) While it does not satisfy the second condition, the "0" state of this model indicates that it is inside the run of length m>0.

Figure 5A:
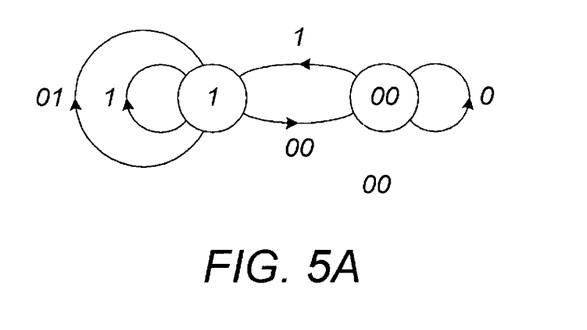
FIGS. 5A–5C illustrate Markov models for a request sequence according to some embodiments of the invention.
Figure 5B:
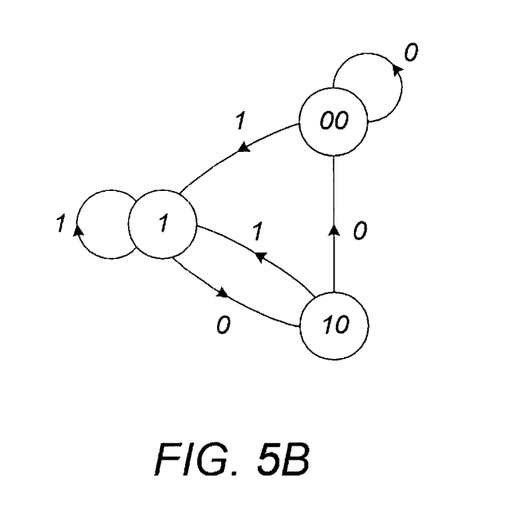

Source models with three unknown parameters satisfy both the above conditions. Two such models are shown in FIGS. 5A–5B. The model in FIG. 5A corresponds to a mixture of independent generating (coding) of runs of lengths m>1 (in the state "00"). This model is the Markov one model (but it is not a Markov chain).

FIG. 5B describes another Markov model with three unknown parameters according to some embodiments of the invention. This model is a typical Markov chain of order two; however, the states "11" and "01" have been joined together into one state "1" in accordance with some embodiments of the invention. The difference between the two models in FIGS. 5A and 5B is that in the model of FIG. 5B, the run of length "01" is encoded in two steps, not one. Hence, the coding probabilities corresponding to these two models do not coincide.

Figure 5C:
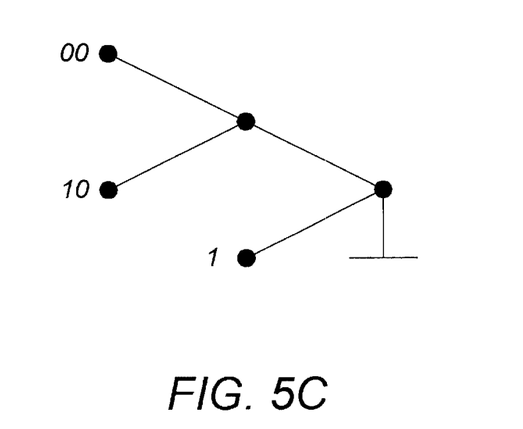

The Markov chain model with three states in FIG. 5B can be shown to be equivalent to a Context Tree model with three leaves, as shown in FIG. 5C. Both the Markov model in FIG. 5B and the Context Tree model in FIG. 5C allow runs of length m=0 and m=1 to be considered separately.

For n≦1000, the insertion of more than three unknown parameters in the source model usually results in a decrease of the coding efficiency. However, the Markov model with three states in FIG. 5B, and the corresponding Context Tree model shown in FIG. 5C, are both well suited for the task of being a source model for the bitmap data, that is, they provide a good trade-off between the number of unknown parameters and the additional information that can be extracted from the preceding symbols in the bitmap.

Since some uncertainty about the statistical properties of bitmaps remains, it is useful to study the efficiency of the Context Tree Weighting (CTW) algorithm (see, e.g., F. Willems, Y. Shtarkov, and T. Tjalkens, "The Context-Tree Weighting Method: Basic Properties," *IEEE Transaction on Information Theory*, 41(3):653–664, May 1995), which is one of the most flexible algorithms relative to unknown statistics of the encoded data.

If the fraction of 0s in $x^n$ does not exceed 0.1, then all the proposed encoders compress $x^n$ not less than twice. The longer the average length of runs in $x^n$ are, the more gain in the compression ratio (even if the fraction of 0s is fixed) since the runs are described using fewer bits than the isolated 0s. Also, with increasing of n there may be an increase in the optimal number of unknown parameters, as well as the universality and efficiency of the encoders, which can be obtained by a simple software implementation of the models in FIGS. 5A–5C.

Figure 6:
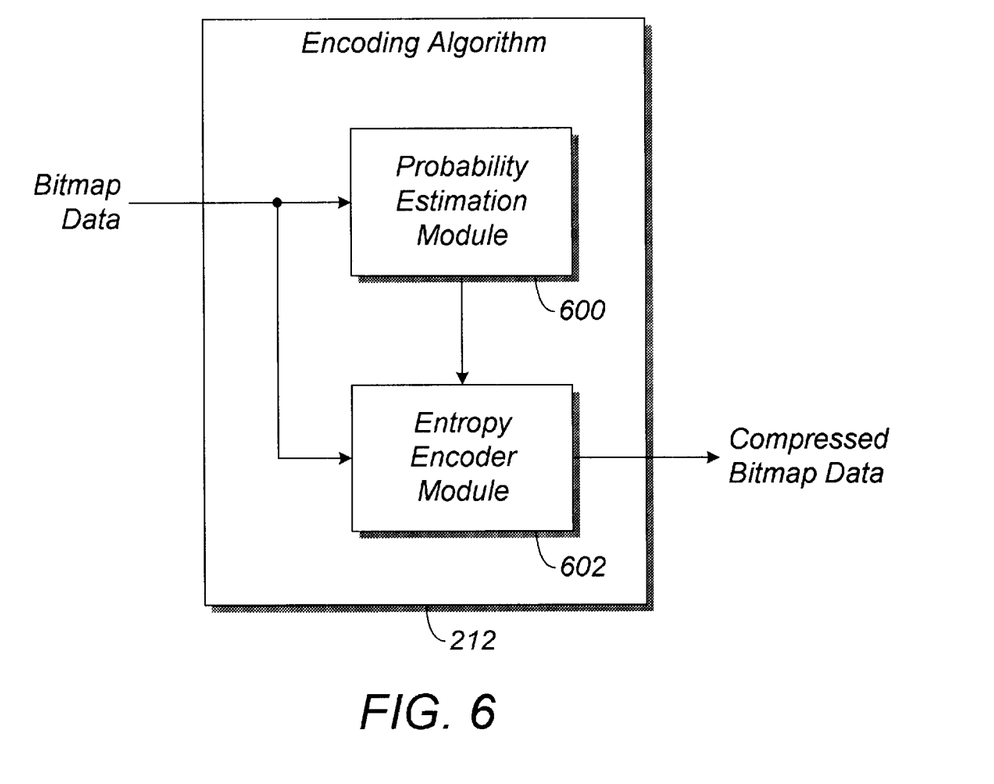
FIG. 6 illustrates an encoder according to some embodiments of the invention.

Based on the foregoing description, the operation of the encoder algorithm 212, according to some embodiments of the invention, will now be described with respect to FIG. 6. As can be seen, the encoding algorithm 212 has a number of functional modules including a probability estimation module 600 and an entropy encoder module 602. The entropy encoder module 602, in some embodiments, may be any entropy encoder modules, but is preferably an arithmetic symbol encoder. Bitmap data (which is the request sequence Rs) from the ARQ algorithm 210 is provided to both the probability estimation module 600 and the entropy encoder module 602. In some embodiments, the probability estimation module 600 uses the bitmap data from the ARQ algorithm to estimate, in accordance with the Markov model in FIG. 5B and Equation (2), the probability associated with each symbol or bit in the bitmap data. More specifically, in some embodiments, Equation (2) is used at each state (e.g., "00", "10", and "1") of the Markov model in FIG. 5B as "counters," with J set to 2 (for a grouping of two symbols) to sum up the symbol probabilities that arise from each state. A separate counter is used for tabulating a 1 and a 0 for each state, thereby resulting in three sets of counters for a total of six counters. The probability estimates are thereafter provided to the entropy encoder module 602 in the form of percentages (e.g., 50%) or ratios (e.g., 1/2) representing the probability for each symbol occurring. The entropy encoder module 602, preferably an arithmetic symbol encoder, uses the estimates to encode the bitmap data on a symbol-by-symbol basis, that is, one symbol at a time, in a known manner, resulting in bitmap data that has been compressed.

By way of an example of the operation of the probability estimation module 500, consider a portion of a bitmap: 0000100 (reading from left to right). The Equation (2) counters, grouped according to their respective states, are $\{a_{00}, b_{00}\}$, $\{a_{10}, b_{10}\}$, and $\{a_1, b_1\}$, where counter $a_{00}$ tracks the number of 0s seen in state "00", counter $b_{00}$ tracks the number of 1s in state "00", and so on. Assuming the probability estimation module 600 starts in state "1", a calculation is made of the probability estimate for the first symbol, 0, in state "1" as follows:

$$P(0)=(a_1+1/2)/(a_1+b_1+1)=(0+1/2)/(0+0+1)=1/2. \quad (3)$$

Comparing Equation (2) to Equation (3), the term $t_f(x^k)$ corresponds to $a_1$ and the term $T(x^k)$ corresponds to $(a_1+b_1)$, where J is set to 2 as mentioned above. Thus, the probability value 1/2 is provided by the probability estimation module 600 to the entropy encoder module 602 to encode the first symbol (0). The probability of a 1 appearing in state "1" is, of course, $P(1)=1-P(0)$. The counters are thereafter updated to reflect the new status thereof, that is, $a_1=1$ and $b_1=0$.

Next, in accordance with the Markov model of FIG. 5B, the probability estimation module 600 moves from state "1" to state "10" because a 0 was received. A calculation is thereafter made for the next symbol, another 0, as follows:

$$P(0)=(a_{10}+1/2)/(a_{10}+b_{10}+1)=(0+1/2)/(0+0+1)=1/2 \quad (4)$$

Thus the probability value 1/2 is used for encoding of the second 0 in the sequence. The probability of a 1 appearing in state "10" is, as above, P(1)=1−P(0). The counters are again updated, namely, $a_{10}$=1 and $b_{10}$=0. The probability estimation module 600 thereafter moves to state "00" in accordance with the Markov model of FIG. 5B, and the calculations are made for the next symbol in the sequence.

A similar process results when the Context Tree model of FIG. 5C is used. For example, assume that the last two encoded symbols were 00, and the next symbol to be encoded is X (i.e., the sequence 00X). In this case, the Equation (2) probability estimation in leaf "00" will be used (which parallels the case of state "00" in FIG. 5B). Likewise, for the sequence 10X, the probability estimation in leaf "10" is used, and for the sequence 1X, the probability estimation in leaf "1" is used.

The process corresponding to the models in FIGS. 5B and 5C, respectively, may be repeated for each symbol until all symbols in the bitmap have been encoded by the entropy encoder module 602. The compressed (encoded) bitmap is thereafter sent from the communication unit 200 to the corresponding sender unit (not expressly shown). It should be noted that, along with the compressed bitmap, the length n of the data being encoded must also be sent to the sender unit because this information is needed in order to properly decode the compressed bitmap. However, the length n is "uniformly" encoded instead, that is, encoded according to standard or conventional methods, since no prior knowledge of the length n is available.

Figure 7:
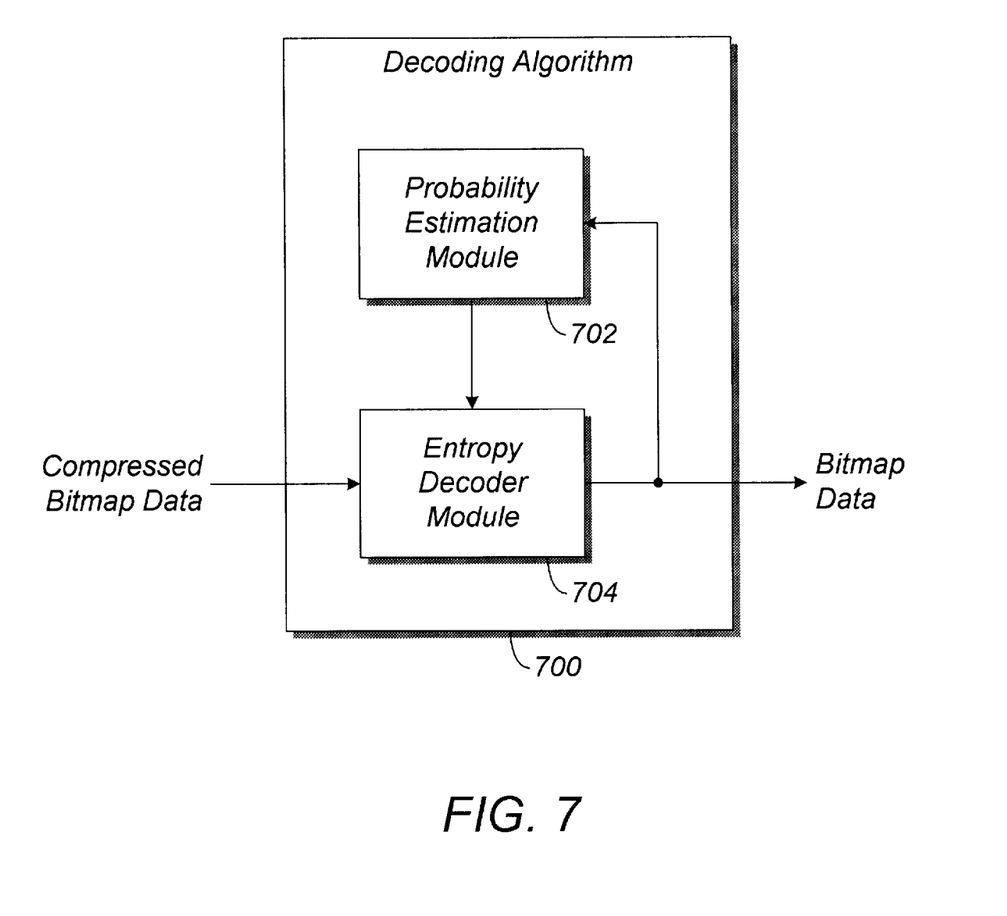
FIG. 7 illustrates a decoder according to some embodiments of the invention.

Decoding of the compressed bitmap may be performed using a decoding algorithm such as the one shown in FIG. 7. The decoding algorithm 700 may reside in a communication unit similar to the communication unit 200 (see FIG. 2) and has a number of functional modules therein including a probability estimation module 702 and an entropy decoder module 704. The entropy decoder module 704 may be any entropy decoder module, but is preferably an arithmetic symbol decoder module that is capable of decoding the compressed bitmap data (using the included length n) received from the communication unit 200 on a symbol-by-symbol basis into a sequence of binary symbols. The decoding process is essentially the inverse of the encoding process described with respect to FIG. 6. The uncompressed bitmap data from the entropy encoder module 704 is thereafter provided to the probability estimation module 702, which uses the data to estimate a probability associated with each symbol or bit in the bitmap. In some embodiments, the probability estimation module 702 uses a process similar to the process described above with respect to the encoding algorithm 212 to estimate the probabilities. The probability estimates are subsequently fed back to the entropy encoder module 704 and used thereby to decode the compressed bitmap data on a symbol-by-symbol basis.

Figure 8:
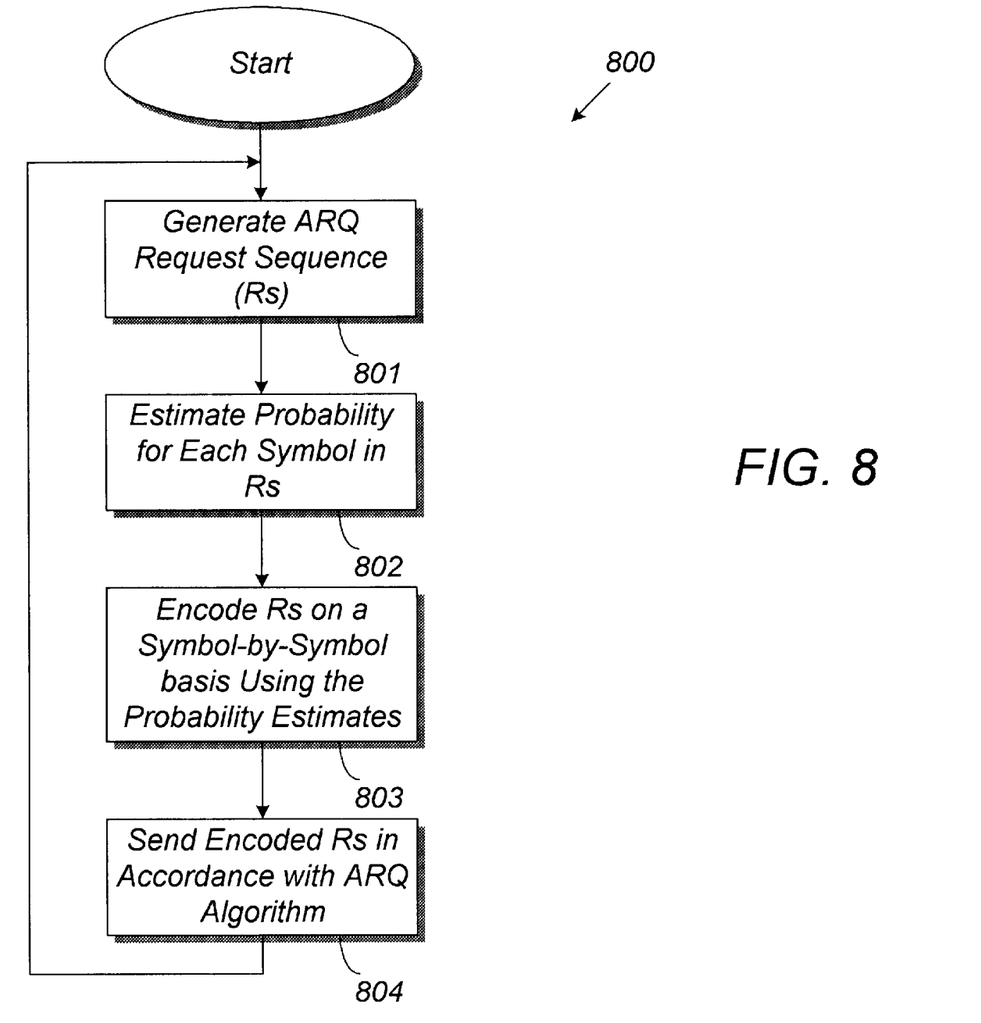
FIG. 8 illustrates an encoding method according to some embodiments of the invention.
Figure 9:
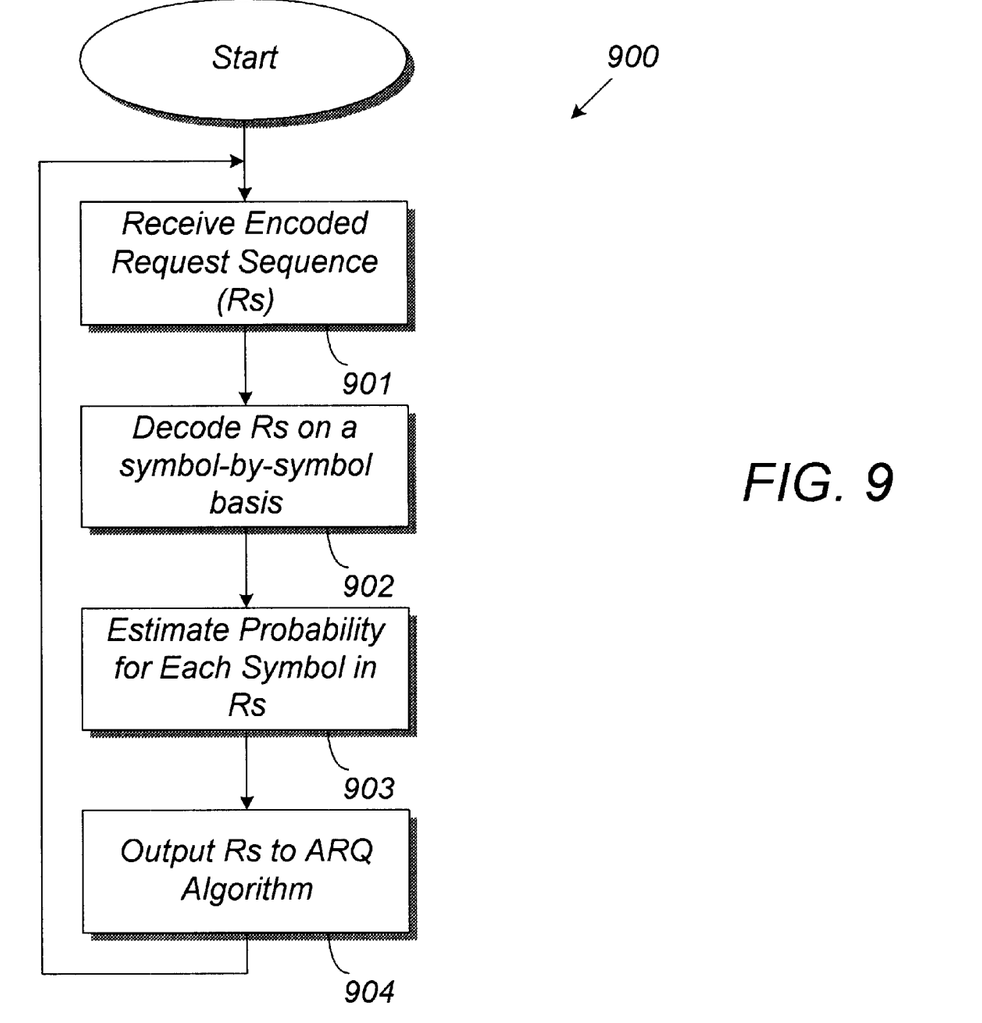
FIG. 9 illustrates a decoding method according to some embodiments of the invention.

FIGS. 8 and 9 illustrate, in a general sense, an encoding method 800 and a decoding method 900, respectively, for encoding and decoding the request sequence Rs in an ARQ algorithm, according to some embodiments of the invention. As can be seen from FIG. 8, the encoding method 800 begins at step 801 wherein the ARQ request sequence is generated at the receiver unit. At step 802, a probability estimate is calculated for each symbol or bit in the request sequence. The probability estimate may be calculated in accordance with the Markov models in FIGS. 5B and 5C using Equation (2) as a counter. In particular, the probability estimate is based on the number of 0s and 1s in each state of the Markov models. An entropy encoder module is used to encode the symbols in the request sequence on a symbol-by-symbol basis using the probability estimates there of instead 803. At step 804, the encoded request sequence is transmitted to the sender unit along with the length n* of the data that is encoded. The process is thereafter repeated at step 801.

Turning now to FIG. 9, the decoding method 900 is similar to the encoding method 800 except in reverse order. At step 901, the encoded request sequence, including the length of the data that is encoded, is received at the sender unit. An entropy decoder module decodes the encoded request sequence at step 902 on a symbol-by-symbol basis into a sequence of binary symbols. As alluded to earlier, the decoding process is essentially the inverse of the encoding process (described with respect to FIG. 8). A probability estimate is calculated for each symbol or bit in the decoded request sequence at step 903. The probability estimates are calculated using the decoded request sequence in accordance with the Markov models of FIGS. 5B and 5C and Equation (2). Finally, at step 904, the decoded request sequence is provided to the sender unit. The process is thereafter repeated at step 901.

Following now are the results of several tests run to confirm the efficacy of the encoder algorithm according to some embodiments of the invention. The basis for the tests are different models of the bit errors occurring on a typical transmission channel such as a channel in UMTS system. Several idealized bit error models as well as data obtained from the UMTS system under different test conditions were used. The error models are based on both independent errors and burst errors. These models help to determine some important characteristics of the ARQ algorithm, which is also often a major concern in a mobile communication system. From the bit errors, the corresponding block errors were produced and used in a typical selective repeat ARQ system.

As an initial matter, the closeness of the main statistical properties of the bitmaps $x^n$ and error sequences $e^q$ which was proposed and used in the selection of bitmap encoders should be checked. Since the distribution of runs of 0s of different lengths defines the coding efficiency entirely, it would be of interest to find out whether the ARQ system preserves the main statistics of runs of errors in the bitmaps. To answer this question, it is sufficient to compare the statistics of runs (of errors and of 0s, respectively) at the input and output of the ARQ algorithm.

The test sequences, which have a wide range of lengths of runs, were generated by: (1) the source of independent errors (IND) with block error probability e; (2) the source of the "medium length bursts" (MB), with the average probability of error equal to e, and the lengths of runs are distributed uniformly in the range [1,10]; and (3) the source of the "large length bursts" (LB), which differs from the previous case only by the range [1,100].

The error sequences resulting in a series of 2500 request sequences Rs of length N=1024 were used. The testing results are given in Table 1 for MB and IND source models respectively (the results for the LB model is not given here). For purposes of economy of the description, the distributions for the MB models are cut off at the level m=14 (it is considered that these levels contains the main "mass" of the distribution). Four values of e (in percent) were used: 1%, 5%, 10% and 15%. The columns, corresponding to any value of e, contain the number of runs of length m in the input error sequences and in the output bitmaps respectively.

TABLE 1

| | Medium Burst | | | | | | | | Independent Errors | | | | | | | |
|---|---|---|---|---|---|---|---|---|---|---|---|---|---|---|---|---|
| | 1% | | 5% | | 10% | | 15% | | 1% | | 5% | | 10% | | 15% | |
| m | | | | | | | | | | | | | | | | |
| 1 | 5.7 | 6.7 | 5.2 | 7.2 | 4.9 | 8.5 | 4.8 | 10.1 | 98.8 | 89.5 | 94.1 | 92.3 | 89.3 | 89.1 | 84.8 | 86.1 |
| 2 | 10.5 | 22.5 | 10.3 | 16.3 | 10.1 | 15.5 | 9.6 | 15.1 | 1.1 | 6.0 | 5.5 | 6.2 | 9.5 | 9.2 | 12.9 | 11.4 |
| 3 | 9.3 | 15.7 | 9.5 | 13.0 | 9.7 | 12.5 | 9.6 | 12.5 | 0.0 | 2.9 | 0.3 | 1.0 | 1.0 | 1.3 | 2.0 | 2.0 |
| 4 | 9.8 | 10.5 | 9.7 | 10.3 | 9.8 | 10.5 | 9.2 | 10.2 | 0.0 | 1.2 | 0.0 | 0.3 | 0.1 | 0.3 | 0.3 | 0.4 |
| 5 | 9.9 | 7.7 | 9.3 | 8.4 | 9.7 | 9.2 | 9.9 | 9.4 | 0.0 | 0.3 | 0.0 | 0.1 | 0.0 | 0.1 | 0.1 | 0.1 |
| 6 | 10.5 | 7.3 | 10.2 | 8.6 | 9.8 | 8.6 | 10.0 | 8.7 | 0.0 | 0.1 | 0.0 | 0.0 | 0.0 | 0.0 | 0.0 | 0.0 |
| 7 | 10.1 | 7.0 | 9.9 | 8.0 | 9.8 | 8.0 | 9.9 | 7.9 | 0.0 | 0.0 | 0.0 | 0.0 | 0.0 | 0.0 | 0.0 | 0.0 |
| 8 | 0.8 | 6.4 | 9.6 | 7.8 | 9.9 | 7.7 | 9.8 | 7.3 | 0.0 | 0.0 | 0.0 | 0.0 | 0.0 | 0.0 | 0.0 | 0.0 |
| 9 | 10.2 | 6.7 | 10.0 | 7.9 | 9.8 | 7.4 | 9.8 | 6.9 | 0.0 | 0.0 | 0.0 | 0.0 | 0.0 | 0.0 | 0.0 | 0.0 |
| 10 | 9.2 | 6.2 | 10.4 | 8.1 | 9.8 | 7.2 | 10.1 | 6.9 | 0.0 | 0.0 | 0.0 | 0.0 | 0.0 | 0.0 | 0.0 | 0.0 |
| 11 | 4.8 | 3.0 | 5.1 | 4.0 | 5.3 | 3.8 | 5.0 | 3.4 | 0.0 | 0.0 | 0.0 | 0.0 | 0.0 | 0.0 | 0.0 | 0.0 |
| 12 | 0.1 | 0.1 | 0.2 | 0.1 | 0.3 | 0.2 | 0.4 | 0.3 | 0.0 | 0.0 | 0.0 | 0.0 | 0.0 | 0.0 | 0.0 | 0.0 |
| 13 | 0.0 | 0.0 | 0.1 | 0.1 | 0.2 | 0.2 | 0.4 | 0.3 | 0.0 | 0.0 | 0.0 | 0.0 | 0.0 | 0.0 | 0.0 | 0.0 |
| 14 | 0.0 | 0.0 | 0.1 | 0.1 | 0.3 | 0.2 | 0.4 | 0.2 | 0.0 | 0.0 | 0.0 | 0.0 | 0.0 | 0.0 | 0.0 | 0.0 |

It follows from the data of Table 1 (and from the similar results for LB model) that the ARQ system does conserve the general "run structure" of the input sequences and have almost the same distribution of runs of different lengths at its output. Furthermore, the average value of n increases with increasing e as well. These observations are valid for all three of the error source models considered.

Thus, it can be concluded that the statistics of input error sequences can be used as a basis for the choice of bitmap encoders. Nevertheless, a small difference exists and it can slightly influence the efficiency of coding. Therefore, following are tests run to examine the efficiency of the chosen compression algorithms relative to other encoders. The same simulation procedure and the same error source models as above were used for the estimation of the efficiency of different compression algorithms. Again, 2500 request sequences Rs of the length N=1024 were considered. The results of the simulations are presented in Table 2.

TABLE 2

| | e | BM | List | MC0 | MC1 | MC2 | CT3 | CW2 | CW3 |
|---|---|---|---|---|---|---|---|---|---|
| IND | 1 | 316.5 | 98.8 | 43.0 | 44.6 | 46.9 | 45.3 | 44.5 | 45.4 |
| IND | 5 | 521.6 | 385.7 | 136.8 | 138.6 | 141.6 | 139.9 | 138.3 | 139.2 |
| IND | 10 | 626.3 | 604.5 | 207.8 | 209.3 | 212.5 | 210.9 | 209.1 | 209.9 |
| MB | 15 | 680.4 | 767.2 | 260.5 | 261.3 | 263.8 | 263.0 | 261.1 | 261.8 |
| MB | 1 | 174.8 | 33.6 | 48.2 | 24.0 | 25.3 | 24.5 | 24.9 | 25.2 |
| MB | 5 | 333.6 | 76.5 | 112.8 | 50.2 | 52.6 | 51.1 | 52.2 | 52.8 |
| MB | 10 | 463.0 | 139.4 | 190.5 | 87.0 | 89.5 | 87.8 | 89.0 | 89.5 |
| MB | 15 | 544.3 | 192.2 | 250.1 | 116.9 | 119.3 | 117.6 | 118.7 | 119.3 |
| LB | 1 | 36.2 | 14.1 | 27.4 | 13.5 | 13.7 | 13.6 | 12.9 | 13.0 |
| LB | 5 | 102.0 | 19.8 | 67.2 | 17.7 | 18.4 | 18.0 | 17.8 | 18.1 |
| LB | 10 | 187.4 | 28.3 | 121.5 | 24.3 | 25.6 | 25.0 | 25.2 | 25.8 |
| LB | 15 | 262.8 | 37.5 | 171.5 | 31.5 | 33.4 | 32.5 | 33.0 | 33.8 |
| Mix | — | 471.4 | 168.2 | 195.8 | 96.1 | 95.2 | 93.5 | 95.1 | 96.0 |
| tc1 | 10 | 349.4 | 54.9 | 170.1 | 41.4 | 42.4 | 42.5 | 42.7 | 43.3 |
| tc2 | 10 | 289.3 | 48.4 | 157.3 | 36.9 | 38.1 | 37.9 | 38.2 | 38.8 |
| tc3 | 10 | 294.3 | 48.2 | 156.3 | 36.8 | 38.1 | 37.8 | 38.2 | 39.0 |
| tc4 | 10 | 337.9 | 53.0 | 168.1 | 40.0 | 41.1 | 41.1 | 41.3 | 42.0 |

The first and second columns describe the error source model and the value of e (in percent) respectively. The next 8 columns contain the values of average length of codeword for one request sequence Rs (including log N=10 bits for the description of variable value of n) for 8 different compression algorithm.

BM is bitmap coding with codeword length log N+$\bar{n}$, where $\bar{n}$ is the average value of n over 2500 request sequences Rs.

"List" is a basic method of describing runs of 0s and 1s. The method points out those positions in the bitmap where changes from a run of one symbol to the other occurs. Each such point requires b bits to describe (if an arithmetic encoder is used), where b is the number of possible remaining positions.

The MC0, MC1 and MC2 are Markov chain encoders of depth 0, 1 and 2 respectively (MC0 corresponds to a memoryless model with one state); CT3 is the Context Tree Markov model described with respect to FIG. 5C; and CW2 and CW3 are Context Tree Weighting algorithms for maximal memory depth 2 and 3 respectively (see, e.g., F. Willems, Y. Shtarkov, and T. Tjalkens, "The Context-Tree Weighting Method: Basic Properties," *IEEE Transaction on Information Theory*, 41(3):653–664, May 1995). Thus, any row of Table 2 contains the average lengths of Rs description for all chosen compression methods with given error source model and value of e.

It can be seen that MC0 is the best algorithm for the IND model, but it is much worse for MB and LB models than the other algorithms.

The last five algorithms give very close results. MC1 and MC2 are slightly better and slightly worse than the other ones. In particular, MC2 is worse than MC1, CT3, and CW2 for any error model (except Mix) and for any value of e since the replacing of state "1"" in MC1 and CT3 by states "01" and "11" in MC2 provides no advantages, but instead increases the number (and the cost) of unknown parameters.

Since the efficiency of the proposed algorithms almost coincides, other properties of the algorithms should be reviewed. For example, the flexibility (i.e., ability to adapt to unpredictable situations) is an important property (after the efficiency). CTW weights the outputs of encoders, corresponding to all CT models with restricted memory depth, i.e., takes into account all such models simultaneously. Therefore, it is not surprising that CW2 and CW3 give almost optimal results for all error models and all values of e; it only illustrates that the best encoders for different bitmaps are different.

The algorithm "List" is the most efficient one for describing runs of large length, but even in this case it is slightly worse than some of the previously discussed algorithms. Furthermore, the important advantage of the proposed algorithms consist of the absence of any preliminary analysis of bitmaps and in a uniform coding process.

Thus, it appears that CT3 or CW2 is the best choice. The number of unknown parameters for the CT3 model is, of course, three. For CW2, it may be said that the number of unknown parameters is variable ranging from one to four parameters. Considering the computational complexity and storage requirement, there are, however, three and seven parameters respectively. Thus, the CT3 method has the least implementation complexity.

The used error models match rather well with the above considered testing problem. In spite that the error models cover a wide range of possible situations, the mixture of different error sequences should be considered too. The row "Mix" of Table 2 contains the results for such a mixture of IND, MB and LB errors. The probabilities for each of these errors changes throughout the data sequence in a way that is similar to a real world situation of mobile communication.

Finally, the results from four test cases (tc1–tc4) which were derived from simulations of a mobile communication system are reported. Note that the results are fairly good for the list compression for these cases. Thus, it may be concluded that this data contains very few independent errors compared to the number of errors generated by burst errors.

The results confirm that an encoder based on CT3 or CW2 give the best results if both compression efficiency and robustness against "independent" errors are considered.

Table 3 shows the standard deviation for the above test runs as a measure of the robustness of the compression algorithm used. The standard deviation was calculated as follows:

$$s = \sqrt{\frac{1}{n-1}\left(\sum_{i=1}^{n} nL_i^2 - \frac{1}{n}\left(\sum_{i=1}^{n} nL_i\right)^2\right)} \quad (5)$$

where $L_i$, i=1,2,..., n, denotes the length of the code words. In general, a lower value of the standard deviation indicates a more robust compression algorithm.

TABLE 3

| | e | BM | List | MC0 | MC1 | MC2 | CT3 | CW2 | CW3 |
|---|---|---|---|---|---|---|---|---|---|
| IND | 1 | 99.0 | 40.2 | 14.3 | 14.6 | 15.0 | 14.7 | 14.5 | 14.5 |
| IND | 5 | 167.2 | 91.9 | 29.1 | 29.2 | 29.4 | 29.4 | 29.2 | 29.2 |
| IND | 10 | 176.2 | 172.2 | 53.1 | 53.1 | 53.3 | 53.3 | 53.1 | 53.1 |
| IND | 15 | 178.1 | 236.0 | 71.3 | 71.0 | 70.9 | 71.2 | 79.9 | 70.9 |
| MB | 1 | 155.2 | 20.4 | 36.6 | 12.4 | 13.3 | 12.8 | 13.6 | 13.8 |
| MB | 5 | 163.1 | 34.5 | 51.4 | 20.7 | 21.2 | 20.9 | 21.1 | 21.2 |
| MB | 10 | 216.3 | 52.9 | 71.1 | 30.6 | 30.8 | 30.5 | 30.6 | 30.7 |
| MB | 15 | 232.5 | 69.1 | 89.3 | 39.2 | 39.4 | 39.2 | 39.3 | 39.3 |
| LB | 1 | 79.2 | 6.4 | 51.4 | 4.7 | 5.3 | 5.0 | 5.6 | 6.0 |
| LB | 5 | 155.2 | 12.3 | 94.6 | 9.4 | 10.4 | 9.9 | 10.8 | 11.3 |
| LB | 10 | 201.0 | 17.4 | 123.7 | 13.7 | 15.0 | 14.4 | 15.2 | 15.6 |
| LB | 15 | 234.3 | 22.4 | 141.8 | 17.9 | 19.1 | 18.6 | 19.1 | 19.4 |
| Mix | — | 213.5 | 92.0 | 112.4 | 45.5 | 43.3 | 43.2 | 43.6 | 43.7 |
| tc1 | 10 | 197.2 | 26.6 | 57.0 | 16.1 | 14.5 | 15.9 | 14.7 | 14.3 |
| tc2 | 10 | 192.7 | 27.5 | 80.5 | 17.5 | 16.5 | 17.5 | 16.7 | 6.4 |
| tc3 | 10 | 195.0 | 25.7 | 73.3 | 16.5 | 15.6 | 16.4 | 15.7 | 15.6 |
| tc4 | 10 | 83.3 | 28.3 | 57.9 | 16.8 | 14.9 | 16.6 | 15.1 | 14.5 |

As demonstrated by the foregoing, embodiments of the invention provide a method and system for encoding the request sequence of an ARQ algorithm. Advantages of the invention include a compression algorithm that is computationally efficient and which may be implemented using a minimum amount of processing resources and program storage space.

While a limited number of embodiments have been disclosed herein, those of ordinary skill in the art will recognize that variations and modifications from the described embodiments may be derived without departing from the scope of the invention. For example, while embodiments of the invention have been described with respect to UMTS, the invention is not to be limited thereto, and may be applicable to any system where feedback from the receiver to the sender is used to realize efficient data transmission. All numerical values disclosed herein are approximate values only regardless of whether that term was used in describing the values. Accordingly, the appended claims are intended to cover all such variations and modifications as falling within the scope of the invention.

What is claimed is:

1. A method of encoding a request sequence from an automatic repeat request system, the method comprising the steps of:

receiving said request sequence from said automatic repeat request system, each request sequence including a sequence of binary symbols;

counting a number of 0s and 1s in said sequence of binary symbols in accordance with a Markov model;

estimating a probability associated with each binary symbol based on the number of 0s and 1s counted in each state of said Markov model; and encoding said binary symbols on a symbol-by-symbol basis using said probability estimates.

2. The method of encoding according to claim 1, wherein said Markov model is a Markov chain of order two with states "11" and "01" joined together into one state "1".

3. The method of encoding according to claim 1, wherein said Markov model is a Context Tree of depth two with states "11" and "01" joined together into one state "1".

4. The method of encoding according to claim 1, wherein said encoding step includes entropy encoding.

5. The method of encoding according to claim 1, wherein said entropy encoding includes arithmetic symbol encoding.

6. The method of encoding according to claim 1, further comprising including a length of said sequence of binary symbols along with said encoded binary symbols.

7. The method of encoding according to claim 1, wherein said step of encoding includes a lossy encoding.

8. The method according to claim 1, wherein said Markov model is a joined states Markov model.

9. The method according to claim 1, wherein said request sequence has a known length that is predefined by said automatic repeat request system.

10. The method according to claim 1, wherein said sequence of binary symbols is encoded independently of any previous sequence of binary symbols.

11. The method according to claim 1, wherein said automatic repeat request system is part of a telecommunication system.

12. A method of decoding an encoded request sequence from an automatic repeat request system, the method comprising the steps of:

receiving said encoded request sequence from said automatic repeat request system;

decoding said encoded request sequence into a sequence of binary symbols on a symbol-by-symbol basis;

counting a number of 0s and 1s in said sequence of binary symbols in accordance with a Markov model; and estimating a probability associated with each binary symbol based on the number of 0s and 1s counted in each state of said Markov model.

13. The method of decoding according to claim 12, wherein said Markov model is a Markov chain of order two with states "11" and "01" joined together into one state "1".

14. The method of decoding according to claim 12, wherein said Markov model is a Context Tree of depth two with states "11" and "01" joined together into one state "1".

15. The method of decoding according to claim 12, wherein said decoding step includes entropy decoding.

16. The method of decoding according to claim 15, wherein said entropy decoding includes arithmetic symbol decoding.

17. The method of decoding according to claim 12, wherein a length of said sequence of binary symbol is included with said encoded request sequence.

18. The method of decoding according to claim 12, wherein said step of decoding includes a lossy decoding.

19. An encoder for encoding a request sequence from an automatic repeat request system, comprising:

a probability estimation module configured to receive said request sequence including a sequence of binary symbols from said automatic repeat request system, said probability estimation module further configured to count a number of 0s and 1s in said sequence of binary symbols in accordance with a Markov model, and to estimate a probability associated with each binary symbol based on the number of 0s and 1s counted in each state of said Markov model; and an encoder module, said encoder module configured to encode said binary symbols on a symbol-by-symbol basis using said probability estimates.

20. The encoder according to claim 19, wherein said Markov model is a Markov chain of order two with states "11" and "01" joined together into one state "1".

21. The encoder according to claim 19, wherein said Markov model is a Context Tree of depth two with states "11" and "01" joined together into one state "1".

22. The encoder according to claim 19, wherein said encoder module includes an entropy encoder module.

23. The encoder according to claim 22, wherein said entropy encoder module includes an arithmetic symbol encoder module.

24. The encoder according to claim 19, wherein said encoder module is further configured to include a length of said sequence of binary symbols along with said encoded binary symbols.

25. The encoder according to claim 19, wherein said encoder module is a lossy encoder module.

26. A decoder for decoding an encoded request sequence from an automatic repeat request system, comprising:

a decoder module configured to receive said encoded request sequence and to decode said encoded request sequence into a sequence of binary symbols, wherein said decoder module decodes said encoded request sequence on a symbol-by-symbol basis; and a probability estimation module configured to count a number of 0s and 1s in said sequence of binary symbols in accordance with a Markov model, and to estimate a probability associated with each binary symbol based on the number of 0s and 1s counted in each state of said Markov model.

27. The decoder according to claim 26, wherein said Markov model is a Markov chain of order two with states "11" and "01" joined together into one state "1".

28. The decoder according to claim 26, wherein said Markov model is a Context Tree of depth two with states "11" and "01" joined together into one state "1".

29. The decoder according to claim 26, wherein said decoder module includes an entropy decoder module.

30. The decoder according to claim 29, wherein said entropy decoder module includes an arithmetic symbol decoder module.

31. The decoder according to claim 26, wherein a length of said sequence of binary symbol is included with said encoded request sequence.

32. The decoder according to claim 26, wherein said decoder module includes a lossy decoder module.

* * * * *

UNITED STATES PATENT AND TRADEMARK OFFICE
CERTIFICATE OF CORRECTION

PATENT NO.      : 6,606,037 B2                                                      Page 1 of 1
DATED           : August 12, 2003
INVENTOR(S)     : Nicklas Ekstrand et al.

It is certified that error appears in the above-identified patent and that said Letters Patent is hereby corrected as shown below:

<u>Title page,</u>
Item [60], Related U.S. Application Data, add:
-- Related U.S. Application Data
Provisional Application No. 60/248,163, filed on November 13, 2000. --
OTHER PUBLICATIONS, add:
-- GUILIANO BENELI, "A New Selective ARQ Scheme with a Finite Buffer"; *European Transactions on Telecommunications and Related Technologies*; May/June 1995; pp. 365-373, No. 3; Milano, IT.

WILLEMS et al., "The Context-Tree Weighting Method: Basic Properties"; *IEEE Transactions on Information Theory*; May 1995; pp. 653-664; Vol. 41, No. 3.

RISSANEN et al., "A Multiplication-Free Multialphabet Arithmetic Code"; *IEEE Transactions on Communications*, February 1989; pp. 93-98; Vol. 27 No. 2; New York, NY, US.

XP-002191678; "Radio Link Control (RLC) Procedures in Packet Transfer Mode" *GSM 04.60* Ver. 8.5.0, released 1999, pp. 73-84; October 2000.

JONES, CHRISTOPHER, "An Efficient Coding System for Long Source Sequences"; *IEEE Transactions on Information Theory*; May 1981; pp. 280-291; Vol IT-27; No. 3.

International Search Report, March 21, 2002. --

<u>Column 13,</u>
Table 2, replace "IND   0   626.3   with -- IND   0   626.3
                 MB  15   680.4"          IND  15   680.4 --

Signed and Sealed this

Twenty-seventh Day of April, 2004

JON W. DUDAS
*Acting Director of the United States Patent and Trademark Office*